(12) United States Patent
Hsiao et al.

(10) Patent No.: US 11,309,044 B2
(45) Date of Patent: Apr. 19, 2022

(54) TEST CIRCUIT FOR TESTING A STORAGE CIRCUIT

(71) Applicant: Vanguard International Semiconductor Corporation, Hsinchu (TW)

(72) Inventors: Jian-Yuan Hsiao, Hsinchu (TW); Po-Yuan Tang, Hsinchu (TW); Wei-Ting Chen, Kaohsiung (TW); Feng-Chih Kuo, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/847,010

(22) Filed: Apr. 13, 2020

(65) Prior Publication Data
US 2021/0318376 A1 Oct. 14, 2021

(51) Int. Cl.
*G11C 29/00* (2006.01)
*G01R 31/3177* (2006.01)
*G01R 31/28* (2006.01)
*G11C 11/41* (2006.01)

(52) U.S. Cl.
CPC .......... *G11C 29/00* (2013.01); *G01R 31/2851* (2013.01); *G01R 31/2856* (2013.01); *G01R 31/3177* (2013.01); *G11C 11/41* (2013.01)

(58) Field of Classification Search
CPC ............ G01R 31/2851; G01R 31/3177; G01R 31/2856; G11C 11/41; G11C 29/00
See application file for complete search history.

(56) References Cited

U.S. PATENT DOCUMENTS

| 5,646,948 | A | * | 7/1997 | Kobayashi | ....... | G01R 31/31935 |
| | | | | | | 714/719 |
| 6,779,144 | B2 | | 8/2004 | Hayashi et al. | | |
| 7,484,141 | B2 | | 1/2009 | Shikata | | |
| 9,911,505 | B2 | * | 3/2018 | Jung | ................ | G11C 29/12015 |

(Continued)

OTHER PUBLICATIONS

T. J. Bergfeld, D. Niggemeyer and E. M. Rudnick, "Diagnostic testing of embedded memories using BIST," Proceedings Design, Automation and Test in Europe Conference and Exhibition 2000 (Cat. No. PR00537), Paris, France, 2000, pp. 305-309. (Year: 2000).*

(Continued)

*Primary Examiner* — Cynthia Britt
(74) *Attorney, Agent, or Firm* — Birch, Stewart, Kolasch & Birch, LLP

(57) ABSTRACT

A test circuit testing a storage circuit and including a controller, a pattern-generator circuit, a comparing circuit, and a first register is provided. The storage circuit includes a storage block. The controller is configured to generate a plurality of internal test signals. The pattern-generator circuit generates and provides test data to the storage circuit according to the internal test signal. The storage circuit writes the test data into the storage block and reads the storage block to generate read data. The comparing circuit compares the test data and the read data to generate a test result. The first register stores the test result. The controller determines whether the storage circuit is working normally according to the test result stored in the first register.

20 Claims, 4 Drawing Sheets

(56) References Cited

U.S. PATENT DOCUMENTS

| | | | | |
|---|---|---|---|---|
| 2002/0075740 A1* | 6/2002 | Sung | ............... | G11C 29/028 |
| | | | | 365/201 |
| 2005/0204234 A1* | 9/2005 | Bacigalupo | ............ | G11C 29/18 |
| | | | | 714/733 |
| 2010/0023817 A1* | 1/2010 | Park | ............... | G11C 29/08 |
| | | | | 714/718 |
| 2012/0072790 A1* | 3/2012 | Burggraf, III | ............ | G11C 29/16 |
| | | | | 714/718 |
| 2013/0170308 A1* | 7/2013 | Mori | ............... | G11C 29/00 |
| | | | | 365/201 |
| 2013/0326299 A1* | 12/2013 | Oshima | ............ | G01R 31/31924 |
| | | | | 714/735 |
| 2015/0325314 A1* | 11/2015 | Ziaja | ............... | G11C 7/1078 |
| | | | | 365/189.02 |

OTHER PUBLICATIONS

Taiwanese Office Action and Search Report for Taiwanese Application No. 109105936 dated Jul. 28, 2020.

* cited by examiner

TEST CIRCUIT FOR TESTING A STORAGE CIRCUIT

BACKGROUND OF THE INVENTION

Field of the Invention

The invention relates to a test circuit, and more particularly to a test circuit that is configured to test a storage circuit.

Description of the Related Art

The size of integrated circuits (IC) is gradually being reduced due to technological developments. In a testing state, the test frequency of a test apparatus cannot be increased due to the cable, the probe card and the packaged pins being coupled between the test apparatus and the IC.

BRIEF SUMMARY OF THE INVENTION

In accordance with an embodiment of the disclosure, a test circuit tests a storage circuit and comprises a controller, a pattern-generator circuit, a comparing circuit and a first register. The storage circuit comprises a storage block. The controller is configured to generate a plurality of internal test signals. The pattern-generator circuit generates and provides test data to the storage circuit according to the internal test signal. The storage circuit writes the test data into the storage block and reads the storage block to generate read data. The comparing circuit compares the test data and the read data to generate a test result. The first register stores the test result. The controller determines whether the storage circuit is working normally according to the test result stored in the first register.

In accordance with another embodiment of the disclosure, an electronic device comprises a storage circuit and a test circuit. The storage circuit comprises a storage block. The test circuit is configured to test the storage circuit and comprises a controller, a pattern-generator circuit, a comparing circuit and a first register. The controller is configured to generate a plurality of internal test signals. The pattern-generator circuit generates and provides test data to the storage circuit according to the internal test signal. The storage circuit writes the test data into the storage block and reads the storage block to generate read data. The comparing circuit compares the test data and the read data to generate a test result. The first register stores the test result. The controller determines whether the storage circuit is working normally according to the test result stored in the first register.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
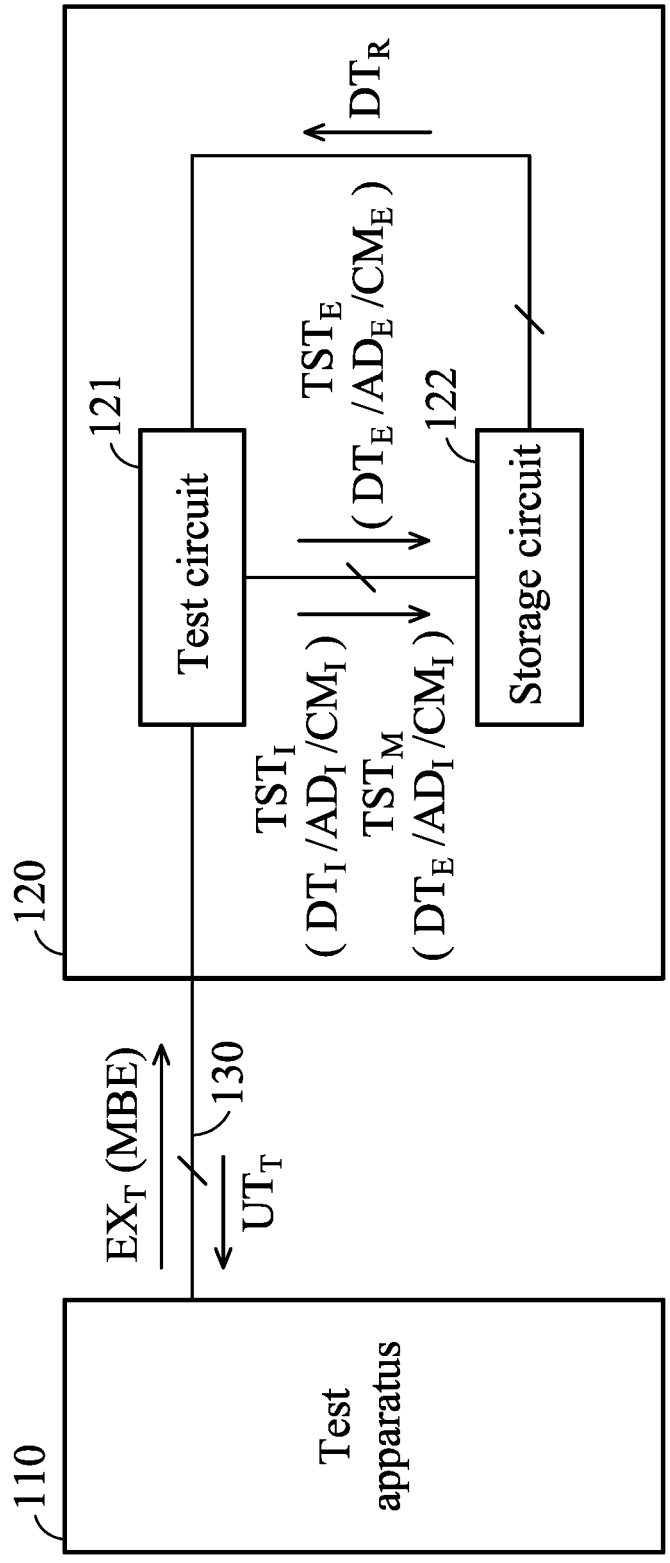
FIG. 1 is a schematic diagram of an exemplary embodiment of a test system according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a test system according to various aspects of the present disclosure. As shown in FIG. 1, the test system 100 comprises a test apparatus 110 and a device under test (DUT) 120. The test apparatus 110 is configured to provide an external test signal $EX_T$ and receives a test result $UT_T$ provided from the DUT 120. In one embodiment, the test apparatus 110 is coupled to the DUT 120 via a cable 130 to provide the external test signal $EX_T$ to the DUT 120. In other embodiments, the test apparatus 110 also receives the test result $UT_T$ from the DUT 120 via the cable 130. In some embodiments, the test apparatus 110 utilizes a wireless method to output the external test signal $EX_T$ and receives the test result $UT_T$ provided from the DUT 120. The format of the external test signal $EX_T$ is not limited in the present disclosure. In one embodiment, the external test signal $EX_T$ comprises test data, an access address and a control command. In other embodiments, the external test signal $EX_T$ further comprises a mode selection signal MBE.

In this embodiment, the DUT 120 is an electronic device. The electronic device operates in a normal test mode, a self-test mode and a mixed test mode according to the characteristic parameter of the mode selection signal MBE. For example, when the characteristic parameter of the mode selection signal MBE meets a first predetermined condition, the DUT 120 enters a normal test mode. In the normal test mode, the DUT 120 generates test signals to the internal storage circuit 122 according to the external test signal $EX_T$. When the characteristic parameter of the mode selection signal MBE meets a second predetermined condition, the DUT 120 enters a self-test mode. In the self-test mode, the DUT 120 self-generates the test signals to the internal storage circuit 122. In this mode, the DUT 120 ignores the external test signal $EX_T$. When the characteristic parameter of the mode selection signal MBE meets a third predetermined condition, the DUT 120 enters a mixed test mode. In the mixed test mode, the DUT 120 tests the storage circuit 122 according to some components of the external test signal $EX_T$ and the test signals generated by the DUT 120.

The kind of the DUT 120 is not limited in the present disclosure. In one embodiment, the DUT 120 is a non-volatile memory or a volatile memory. In some embodiments, the DUT 120 may be other kinds of electronic elements. In this embodiment, the DUT 120 comprises a test circuit 121 and a storage circuit 122.

When the characteristic parameter of the mode selection signal MBE meets a first predetermined condition, the test circuit 121 receives and processes the external test signal $EX_T$ to generate test pattern $TST_E$. In one embodiment, the test pattern $TST_E$ comprises test data $DT_E$, an access address $AD_E$ and a control command $CM_E$. In this case, the storage circuit 122 performs a write operation or a read operation according to the control command $CM_E$. For example, when the control command $CM_E$ is a write command, the storage circuit 122 performs a write operation to write the test data $DT_E$ to the storage block corresponding to the access address $AD_E$. When the control command $CM_E$ is a read command, the storage circuit 122 performs a read operation to read the data stored in the storage block corresponding to the access address $AD_E$ and generates read data $DT_R$.

When the characteristic parameter of the mode selection signal MBE meets a second predetermined condition, the test circuit 121 self-generates a test pattern $TST_I$ to the storage circuit 122. In one embodiment, the test pattern $TST_I$ comprises test data $DT_I$, an access address $AD_I$ and a control command $CM_I$. The storage circuit 122 performs a write operation or a read operation according to the control command $CM_I$. For example, when the control command $CM_I$ is a write command, the storage circuit 122 performs a write operation to write the test data $DT_I$ to a storage block corresponding to the access address $AD_I$. When the control command $CM_I$ is a read command, the storage circuit 122 performs a read operation to read the data stored in the storage block corresponding to the access address $AD_I$ and generates read data $DT_R$.

When the characteristic parameter of the mode selection signal MBE meets a third predetermined condition, the test circuit 121 generates a test pattern $TST_M$ according to the external test signal $EX_T$ and the test signals generated by the test circuit 121. In one embodiment, the test pattern $TST_M$ comprises the test data $DT_E$, the access address $AD_I$ and the control command $CM_I$. The storage circuit 122 performs a write operation or a read operation according to the control command $CM_I$. For example, when the control command $CM_I$ is a write command, the storage circuit 122 performs a write operation to write the test data $DT_E$ to the storage block corresponding to the access address $AD_I$. When the control command $CM_I$ is a read command, the storage circuit 122 performs a read operation to read data stored in the storage block corresponding to the access address $AD_I$ and generate read data $DT_R$.

The kind of storage circuit 122 is not limited in the present disclosure. The storage circuit 122 may be a non-volatile storage circuit or a volatile storage circuit. In one embodiment, the storage circuit 122 is a static random access memory (SRAM).

The test circuit 121 determines whether the storage circuit 122 is working normally according to the read data $DT_R$ provided by the storage circuit 122. The disclosure does not limit how the test circuit 121 utilizes the read data $DT_R$ to determine whether the storage circuit 122 is working normally. In one embodiment, the test circuit 121 compares the read data $DT_R$ with predetermined data. When the read data $DT_R$ matches the predetermined data, it means that the access operation of the storage circuit 122 is normal. When the read data $DT_R$ does not match the predetermined data, it means that the access operation of the storage circuit 122 is not normal. In one embodiment, the test circuit 121 records the number of times that the access operation of the storage circuit 122 is not normal. In another embodiment, when the storage circuit 122 is not normal, the test circuit 121 immediately notifies the test apparatus 110.

Figure 2A:
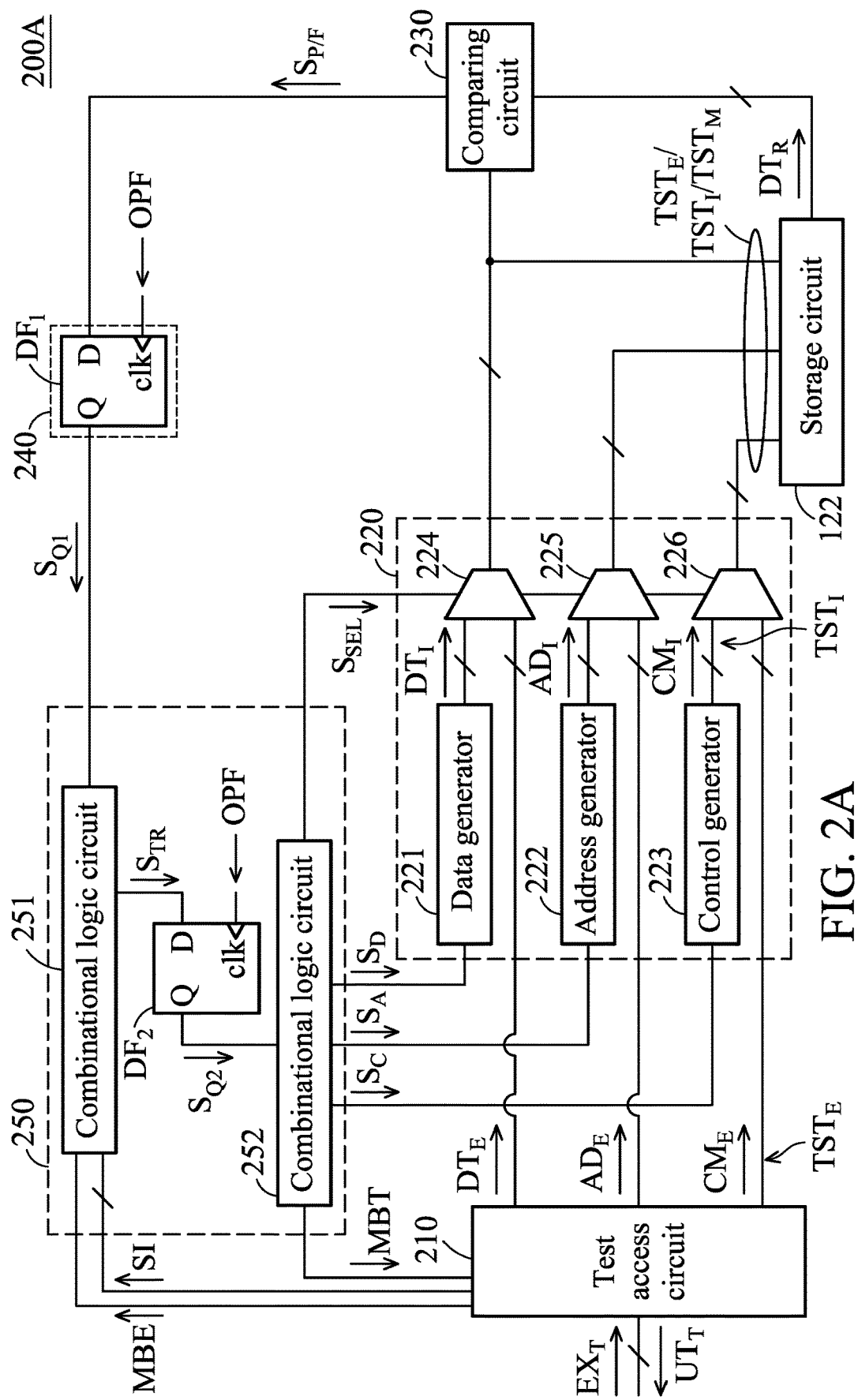
FIG. 2A is a schematic diagram of an exemplary embodiment of a test circuit according to various aspects of the present disclosure.

FIG. 2A is a schematic diagram of an exemplary embodiment of a test circuit according to various aspects of the present disclosure. As shown in FIG. 2A, the test circuit 200A comprises a test access circuit 210, a pattern-generator circuit 220, a comparing circuit 230, a register 240 and a controller 250. The test access circuit 210 is configured to receive and process the external test signal $EX_T$ to generate the test data $DT_E$ (also called external test data), the access address $AD_E$ and the control command $CM_E$. In one embodiment, each of the test data $DT_E$, the access address $AD_E$ and the control command $CM_E$ comprises a plurality of bits. In this embodiment, the test data $DT_E$, the access address $AD_E$ and the control command $CM_E$ constitute the test pattern $TST_E$.

The structure of the test access circuit 210 is not limited in the present disclosure. Any circuit can serve as the test access circuit 210, as long as the circuit is capable of decoding the external test signal $EX_T$ to obtain the test data $DT_E$, the access address $AD_E$ and the control command $CM_E$. In one embodiment, the test access circuit 210 comprises a test access port (TAP).

In other embodiment, the test access circuit 210 further outputs a mode selection signal MBE and series data SI to the controller 250. In one embodiment, when the characteristic parameter of the mode selection signal MBE meets a first predetermined condition, the test access circuit 210 receives and processes the external test signal $EX_T$ to generate the test pattern $TST_E$. However, when the characteristic parameter of the mode selection signal MBE meets a second predetermined condition, the test access circuit 210 does not process the external test signal $EX_T$. When the characteristic parameter of the mode selection signal MBE meets a third predetermined condition, the test access circuit 210 processes the external test signal $EX_T$ to generate the test data $DT_E$.

The pattern-generator circuit 220 is configured to provide the test pattern $TST_E$, $TST_I$ or $TST_M$ to the storage circuit 122. For example, in a normal test mode (for example, the characteristic parameter of the mode selection signal MBE meets a first predetermined condition), the pattern-generator circuit 220 provides the test pattern $TST_E$ to the storage circuit 122. In a self-test mode (for example, the characteristic parameter of the mode selection signal MBE meets a second predetermined condition), the pattern-generator circuit 220 processes the internal test signals (such as internal data component $S_D$, a address signal $S_A$ and a control signal $S_C$) to generate the test pattern $TST_I$ and provides the test pattern $TST_I$ to the storage circuit 122. In a mixed test mode (for example, the characteristic parameter of the mode selection signal MBE meets a third predetermined condition), the pattern-generator circuit 220 generates the test pattern $TST_M$ according to the external test signal $EX_T$ and the internal test signals and outputs the test pattern $TST_M$ to the storage circuit 122. In this embodiment, the test pattern $TST_E$ comprises the test data $DT_E$, the access address $AD_E$ and the control command $CM_E$. Additionally, the test pattern $TST_I$ comprises the test data $DT_I$, the access address $AD_I$ and the control command $CM_I$. In other embodiments, the test pattern $TST_M$ comprises the test data $DT_E$, the access address $AD_I$ and the control command $CM_I$.

The structure of the pattern-generator circuit 220 is not limited in the present disclosure. Any circuit can serve as a pattern-generator circuit 220, as long as the circuit is capable of generating a test pattern. In this embodiment, the pattern-generator circuit 220 comprises a data generator 221, an address generator 222, a control generator 223 and selection circuits 224~226.

The data generator 221 generates test data $DT_I$ (referred to as the internal test data). The disclosure does not limit how the data generator 221 generates test data $DT_I$. In one embodiment, the data generator 221 utilizes a specific algorithm to calculate the internal data component $S_D$ to generate the test data $DT_I$. For example, assume that the value of the internal data component $S_D$ is 01. In this case, the data generator 221 transforms and processes the internal data component $S_D$ to generate the test data $DT_I$. The value of the test data $DT_I$ may be 0101 0101 0101 0101.

The selection circuit 224 outputs the test data $DT_I$ or $DT_E$ to the storage circuit 122 according to a selection signal $S_{SEL}$. For example, when the selection signal $S_{SEL}$ is at a first level (e.g., a low level), the selection circuit 224 outputs the test data $DT_I$. When the selection signal $S_{SEL}$ is at a second level (e.g., a high level), the selection circuit 224 outputs the test data $DT_E$. The structure of the selection circuit 224 is not limited in the present disclosure. In one embodiment, the selection circuit 224 is a multiplexer.

The address generator 222 generates an access address $AD_I$ according to the address signal $S_A$. The present disclosure does not limit how the address generator 222 generates the access address $AD_I$. In one embodiment, the address generator 222 comprises a counter (not shown). The counter adjusts a counting value according to the address signal $S_A$. In this case, the address generator 222 generates the access address $AD_I$ according to the counting value of the counter disposed in the address generator 222. In one embodiment, the counter is an up counter or a down counter.

The selection circuit 225 outputs the access address $AD_I$ or $AD_E$ to the storage circuit 122 according to the selection signal $S_{SEL}$. For example, when the selection signal $S_{SEL}$ is at a first level, the selection circuit 225 outputs the access address $AD_I$. When the selection signal $S_{SEL}$ is at a second level, the selection circuit 225 outputs the access address $AD_E$. The structure of the selection circuit 225 is not limited in the present disclosure. In one embodiment, the selection circuit 225 is a multiplexer.

The control generator 223 generates a control command $CM_I$ according to the control signal $S_C$. In one embodiment, when the control signal $S_C$ is at a first level, the control generator 223 generates a write command to direct the storage circuit 122 to perform a write operation. When the control signal $S_C$ is at a second level, the control generator 223 generates a read command to direct the storage circuit 122 to perform a read operation.

The selection circuit 226 outputs the control command $CM_I$ or $CM_E$ to the storage circuit 122 according to the selection signal $S_{SEL}$. For example, when the selection signal $S_{SEL}$ is at a first level, the selection circuit 226 outputs the control command $CM_I$. When the selection signal $S_{SEL}$ is at a second level, the selection circuit 226 outputs the control command $CM_E$. The structure of the selection circuit 226 is not limited in the present disclosure. In one embodiment, the selection circuit 226 is a multiplexer.

In other embodiments, the selection circuit 224 is controlled by a first selection signal, the selection circuit 225 is controlled by a second selection signal, and the selection circuit 226 is controlled by a third selection signal. When the selection circuits 224~226 are controlled by different selection signals, the selection circuits 224~226 can selectively output the internal test signals or the external test signals to the storage circuit 122. For example, when the characteristic parameter of the mode selection signal MBE meets a first predetermined condition, the controller 250 may set each of the first to third selection signals to a second level (e.g., a high level). Therefore, the selection circuit 224 outputs the test data $DT_E$, the selection circuit 225 outputs the access address $AD_E$, and the selection circuit 226 outputs the control command $CM_E$. In this case, the test data $DT_E$, the access address $AD_E$ and the control command $CM_E$ constitute the test pattern $TST_E$.

When the characteristic parameter of the mode selection signal MBE meets a second predetermined condition, the controller 250 may set the first, second, and third selection signals to a first level (e.g., a low level) each. Therefore, the selection circuit 224 outputs the test data $DT_I$, the selection circuit 225 outputs the access address $AD_I$, and the selection circuit 226 outputs the control command $CM_I$. In this case, the test data $DT_I$, the access address $AD_I$ and the control command $CM_I$ constitute the test pattern $TST_I$.

When the characteristic parameter of the mode selection signal MBE meets a third predetermined condition, the controller 250 may set the first selection signal to a second level (e.g., a high level) and set each of the second and the third selection signals to a first level (e.g., a low level). Therefore, the selection circuit 224 outputs the test data $DT_E$, the selection circuit 225 outputs the access address $AD_I$, and the selection circuit 226 outputs the control command $CM_I$. In this case, the test data $DT_E$, the access address $AD_I$ and the control command $CM_I$ constitute the test pattern $TST_M$. In one embodiment, the test data $DT_E$ is set by a user. In this case, the user can input the test data $DT_E$ to the test circuit 200A by the test apparatus 110.

The storage circuit 122 operates according to the test pattern $TST_E$, $TST_I$ or $TST_M$. Take the test pattern $TST_I$ an example, the storage circuit 122 enters a write mode or a read mode according to the control command $CM_I$. For example, when the control command $CM_I$ meets a predetermined value, the storage circuit 122 enters a write mode to write the test data $DT_I$ into the storage block corresponding to the access address $AD_I$. When the control command $CM_I$ does not met the predetermined value, the storage circuit 122 enters a read mode. In the read mode, the storage circuit 122 reads the data stored in the storage block corresponding to the access address $AD_I$ to generate the read data $DT_R$. In this embodiment, the read data $DT_R$ has a plurality of bits, such as 16 bits.

The comparing circuit 230 compares the test data $DT_I$/$DT_E$ and the read data $DT_R$ to generate a test result $S_{P/F}$. In the normal test mode and the mixed test mode, the comparing circuit 230 compares the test data $DT_E$ and the read data $DT_R$. In the self-test mode, the comparing circuit 230 compares the test data $DT_I$ and the read data $DT_R$. In this embodiment, each of the test data $DT_I$, the test data $DT_E$ and read data $DT_R$ has a plurality of bits (e.g., 16 bits), and the test result $S_{P/F}$ has a single bit.

The register 240 stores the test result $S_{P/F}$. In this embodiment, the register 240 is a D flip-flop $DF_1$. The input terminal D of the D flip-flop $DF_1$ receives the test result $S_{P/F}$. The clock terminal clk of the D flip-flop $DF_1$ receives an operation clock OPF. In this case, the operation clock OPF is utilized to trigger the D flip-flop $DF_1$. In a first cycle of the operation clock OPF, the D flip-flop $DF_1$ receives the test result $S_{P/F}$. In a second cycle of the operation clock OPF, the D flip-flop $DF_1$ uses the test result $S_{P/F}$ as an output signal $S_{Q1}$, and provides the output signal $S_{Q1}$ to the controller 250. In this embodiment, the output signal $S_{Q1}$ has a single bit.

The controller 250 is configured to generate the internal data component $S_D$, the address signal $S_A$ and the control signal $S_C$ and is configured to determine whether the storage circuit 122 is working normally according to the output signal $S_{Q1}$. In one embodiment, when the storage circuit 122 executes a write operation, the controller 250 ignores the output signal $S_{Q1}$ to stop determining whether the storage circuit 122 is working normally. However, the storage circuit 122 executes a read operation, the controller 250 starts to determine whether the storage circuit 122 is working normally according to the output signal $S_{Q1}$ and then generates a test output signal MBT according to the determination result.

In one embodiment, the controller 250 determines whether to generate the internal data component $S_D$, the address signal $S_A$ and the control signal $S_C$ according to the characteristic parameter of the mode selection signal MBE. For example, when the characteristic parameter of the mode selection signal MBE meets a first predetermined condition, the controller 250 stops providing the internal data component $S_D$, the address signal $S_A$ and the control signal $S_C$ to the pattern-generator circuit 220. At this time, the controller 250 utilizes the selection signal $S_{SEL}$ to require the pattern-generator circuit 220 to provide the test data $DT_E$, the access address $AD_E$ and the control command $CM_E$ to the storage circuit 122. When the characteristic parameter of the mode selection signal MBE meets a second predetermined condition, the controller 250 provides the internal data component $S_D$, the address signal $S_A$ and the control signal $S_C$. Therefore, the pattern-generator circuit 220 generates test data $DT_I$, the access address $AD_I$ and the control command $CM_I$ according to the internal data component $S_D$, the address signal $S_A$ and the control signal $S_C$. In this case, the controller 250 utilizes the selection signal $S_{SEL}$ to require the pattern-generator circuit 220 to provide the test data $DT_I$, the access address $AD_I$ and the control command $CM_I$ to the storage circuit 122. When the characteristic parameter of the mode selection signal MBE meets a third predetermined condition, the controller 250 provides the address signal $S_A$ and the control signal $S_C$. At this time, pattern-generator circuit 220 generates the access address $AD_I$ and the control command $CM_I$ according to the address signal $S_A$ and the control signal $S_C$. In this case, the controller 250 utilizes the selection signal $S_{SEL}$ to require the pattern-generator circuit 220 to provide the test data $DT_E$ provided from the external test apparatus, the access address $AD_I$ and the control command $CM_I$ to the storage circuit 122.

The circuit structure of the controller 250 is not limited in the present disclosure. In this embodiment, the controller 250 comprises combinational logic circuits 251 and 252, and a D flip-flop $DF_2$. The combinational logic circuit 251 determines whether the storage circuit 122 is working normally according to the output signal $S_{Q1}$. When the storage circuit 122 is not working normally, the combinational logic circuit 251 decodes an abnormal signal into abnormal state codes and records information indicating that the storage circuit 122 is not working normally in the D flip-flop $DF_2$. For example, in the self-test mode or the mixed test mode, if the read data $DT_R$ does not match with the test data $DT_I$, the output signal $S_{Q1}$ may be at a high level. On the contrary, if the read data $DT_R$ matches with the test data $DT_I$, the output signal $S_{Q1}$ may be at a low level. Therefore, the combinational logic circuit 251 is capable of determining whether the storage circuit 122 is working normally according to the level of the output signal $S_{Q1}$.

In one embodiment, when the storage circuit 122 is not working normally, the combinational logic circuit 251 may generate a state signal $S_{TR}$. The D flip-flop $DF_2$ and the combinational logic circuit 252 decode the state signal $S_{TR}$ to generate an abnormal notice signal (e.g., MBT) to the external test apparatus. In other embodiments, the D flip-flop $DF_2$ records the number of times that the storage circuit 122 is not working normally. In this embodiment, each when the combinational logic circuit 251 detects read data $DT_R$, the combinational logic circuit 251 generates a state signal $S_{TR}$.

The D flip-flop $DF_2$ is triggered by the operation clock OPF and receives the state signal $S_{TR}$. In this case, the D flip-flop $DF_2$ uses the state signal $S_{TR}$ as an output signal $S_{Q2}$. As shown in FIG. 2A, the input terminal D of the D flip-flop $DF_2$ receives the state signal $S_{TR}$. The output terminal Q of the D flip-flop $DF_2$ provides the output signal $S_{Q2}$. The clock terminal clk of the D flip-flop $DF_2$ receives the operation clock OPF. In one embodiment, when the D flip-flop $DF_1$ provides the output signal $S_{Q1}$ to the combinational logic circuit 251 (i.e., in the second cycle of the operation clock OPF), the D flip-flop $DF_2$ provides the output signal $S_{Q2}$ to the combinational logic circuit 252.

The combinational logic circuit 252 generates the internal data component $S_D$, the address signal $S_A$, the control signal $S_C$ and the test output signal MBT according to the output signal $S_{Q2}$. In one embodiment, when the combinational logic circuit receives the output signal $S_{Q2}$, the combinational logic circuit 252 generates the internal data component $S_D$, the address signal $S_A$, the control signal $S_C$ and the test output signal MBT. In some embodiments, the test output signal MBT indicates whether the storage circuit 122 is working normally. In this case, the test access circuit 210 processes (e.g., encodes) the test output signal MBT to generate the test result $UT_T$ to the external test apparatus (e.g., the test apparatus 110 of FIG. 1).

For brevity, the combinational logic circuit 252 is referred to as a first combinational logic circuit, the pattern-generator circuit 220 is referred to as a second combinational logic circuit, the comparing circuit 230 is referred to as a third combinational logic circuit, and the combinational logic circuit 251 is referred to as a fourth combinational logic circuit. When the second combinational logic circuit outputs the test pattern ($TST_E$, $TST_I$ or $TST_M$), the storage circuit 122 generates the read data $DT_R$. The third combinational logic circuit generates and provides the test result $S_{P/F}$ to the fourth combinational logic circuit according to the read data $DT_R$. Since there is more elements between the storage circuit 122 and the fourth combinational logic circuit and each element has fixed delay time, the fourth combinational logic circuit needs to wait for a long time before receiving the test result $S_{P/F}$.

However, because the register 240 stores the test result $S_{P/F}$, the working cycle of the DUT 120 in the self-test mode is reduced so that the speed of the DUT 120 performing the self-test operation is fast. For example, in the first cycle of the operation clock OPF, the first, second, and third combinational logic circuits operate to generate a first test result. In the second cycle of the operation clock OPF, the D flip-flop $DF_1$ stores the first test result, uses the first test result as the output signal $S_{Q1}$, and provides the output signal $S_{Q1}$ to the fourth combinational logic circuit (i.e., 251), wherein the second cycle is subsequent to the first cycle. At this time, the first, second, and third combinational logic circuits operate to generate a second test result. In the third cycle of the operation clock OPF, the D flip-flop $DF_1$ stores the second test result, uses the second test result as the output signal $S_{Q1}$, and provides the output signal $S_{Q1}$ to the fourth combinational logic circuit (i.e., 251), wherein the third cycle is subsequent to the second cycle. At this time, because the first, second, and third combinational logic circuits operate to generate a third test result, the D flip-flop $DF_1$ stores the third test result in a fourth cycle of the operation clock OPF, wherein the fourth cycle is adjacent and subsequent to the third cycle.

In this embodiment, the D flip-flop $DF_1$ stores the previous test result so that the first, second, and third combinational logic circuits do not need to wait for the fourth combinational logic circuit to finish operation, and so that the first, second, and third combinational logic circuits immediately generate new test results. Therefore, the working cycle is reduced. Furthermore, since the third combinational logic circuit outputs a test result $S_{P/F}$ having a single bit, the single register 240 is used to store the single bit.

Figure 2B:
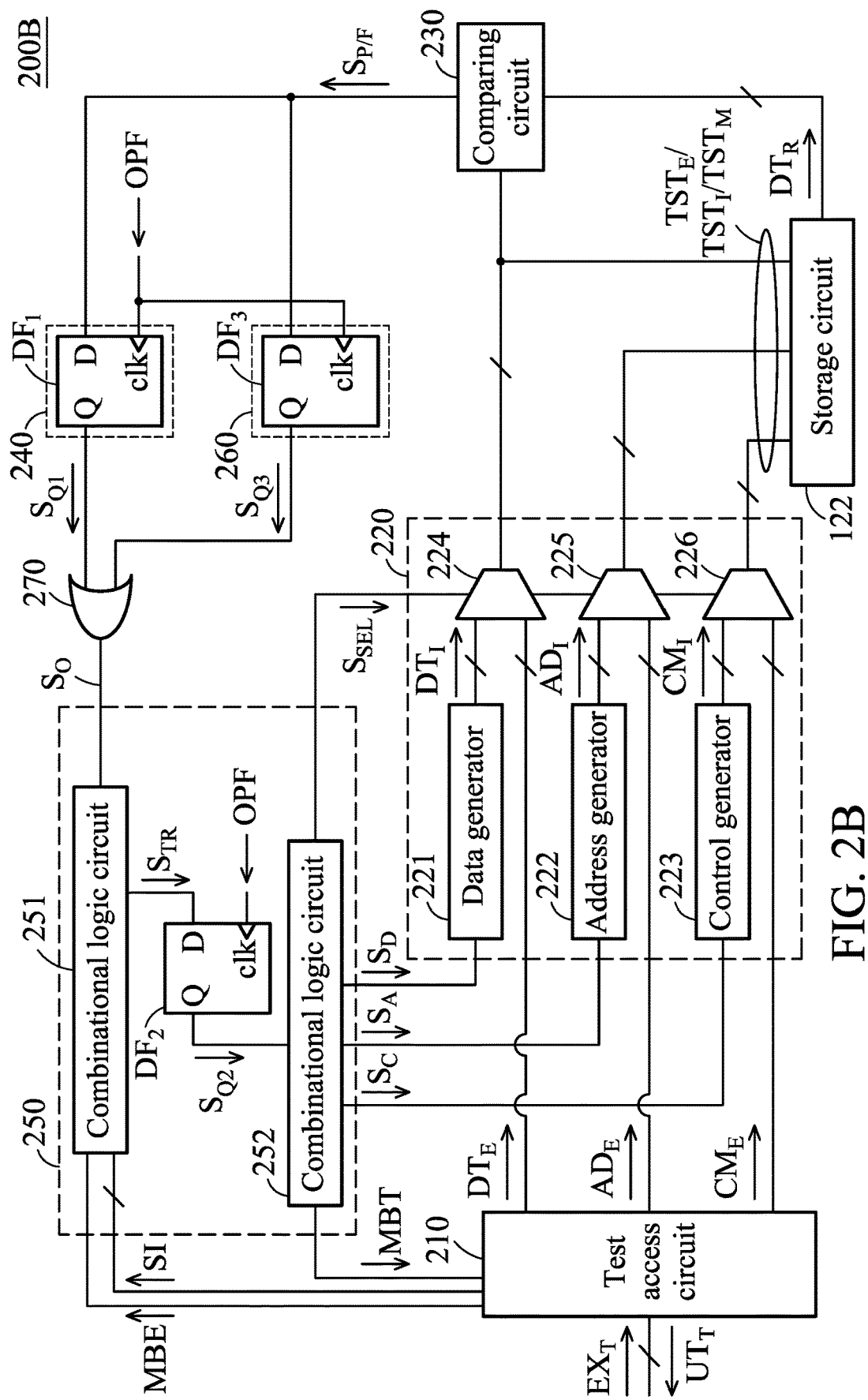
FIG. 2B is a schematic diagram of another exemplary embodiment of the test circuit according to various aspects of the present disclosure.

FIG. 2B is a schematic diagram of another exemplary embodiment of the test circuit according to various aspects of the present disclosure. FIG. 2B is similar to FIG. 2A except for the addition of a register 260 and a logic gate 270. The register 260 is configured to store the test result $S_{P/F}$. In one embodiment, the register 260 is a D flip-flop $DF_3$. The D flip-flop $DF_3$ receives the test result $S_{P/F}$, and uses the test result $S_{P/F}$ as an output signal $S_{Q3}$ according to the operation clock OPF. In this embodiment, the input terminal D of the D flip-flop $DF_3$ receives the test result $S_{P/F}$, the clock terminal clk of the D flip-flop $DF_3$ receives the operation clock OPF, and the output terminal Q of the D flip-flop $DF_3$ provides the output signal $S_{Q3}$.

The logic gate 270 is coupled to the output terminals of the registers 240 and 260 and generates an output signal $S_O$ according to the output signals $S_{Q1}$ and $S_{Q3}$. The kind of logic gate 270 is not limited in the present disclosure. In one embodiment, the logic gate 270 is an OR gate. When each of the output signals $S_{Q1}$ and $S_{Q3}$ is at a high level (for example, the read data $DT_R$ does not match the test data $DT_I/DT_E$), the logic gate 270 outputs the output signal $S_O$ that is at a high level. When each of the output signals $S_{Q1}$ and $S_{Q3}$ is at a low level, it means that the read data $DT_R$ matches the test data $DT_I/DT_E$. Therefore, the logic gate 270 outputs the output signal $S_O$ that is at the low level. In this case, the controller 250 determines whether the read data $DT_R$ matches the test data $DT_I/DT_E$ according to the level of the output signal $S_O$.

In this embodiment, since both of the registers 240 and 260 store the test result $S_{P/F}$, when one of the registers 240 and 260 fails, another of the registers 240 and 260 is capable of outputting the test result $S_{P/F}$ to the logic gate 270. For example, when the read data $DT_R$ does not match the test data $DT_I/DT_E$, the output signals $S_{Q1}$ and $S_{Q3}$ are at the high level. If the register 240 fails and outputs the output signal $S_{Q1}$ that is at the low level, the register 260 still generates the output signal $S_{Q3}$ that is at the high level. The logic gate 270 outputs the output signal $S_O$ that is at the high level.

Since the registers 240 and 260 stores the same test result, when one of the registers 240 and 260 fails, the other is capable of providing the output signal $S_{Q1}$ or $S_{Q3}$ to the logic gate 270. Therefore, the controller 250 can determine whether the storage circuit 122 is working normally according to the output signal $S_O$ generated by the logic gate 270.

In other embodiments, the logic gate 270 is a AND gate. When the read data $DT_R$ fits the test data $DT_I/DT_E$, the output signals $S_{Q1}$ and $S_{Q3}$ are at the high level. Therefore, the logic gate 270 outputs the output signal $S_O$ that is at the high level. However, when the read data $DT_R$ does not fit the test data $DT_I/DT_E$, the output signals $S_{Q1}$ and $S_{Q3}$ are at the low level. Therefore, the logic gate 270 outputs the output signal $S_O$ that is at the low level.

Figure 3:
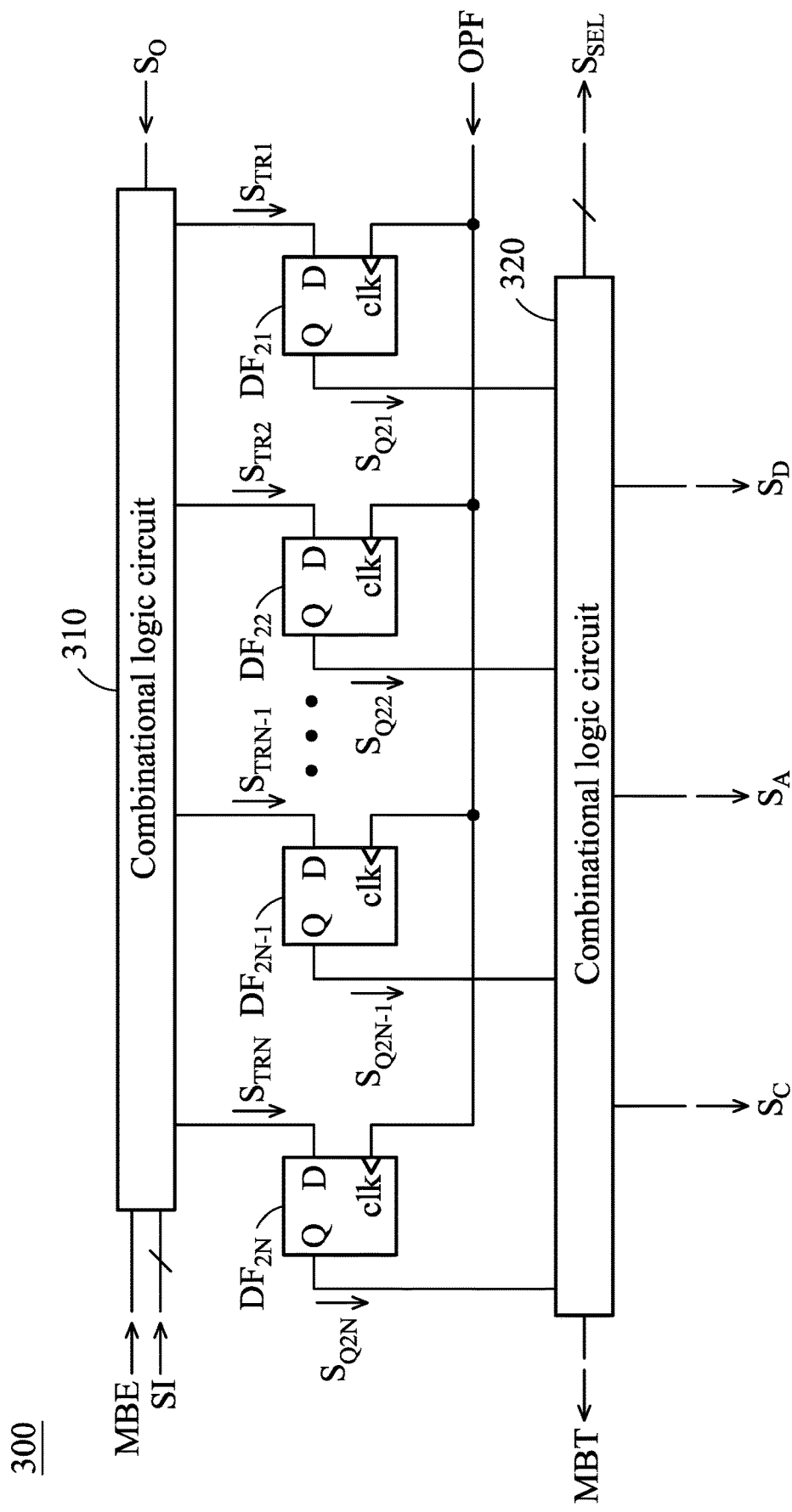
FIG. 3 is a schematic diagram of an exemplary embodiment of a controller according to various aspects of the present disclosure.

FIG. 3 is a schematic diagram of another exemplary embodiment of the controller 250 according to various aspects of the present disclosure. As shown in FIG. 3, the controller 300 comprises combinational logic circuits 310 and 320, and D flip-flops $DF_{21}$~$DF_{2N}$. The combinational logic circuit 310 determines whether the storage circuit 122 is working normally according to the mode selection signal MBE, the output signal $S_O$, a series data SI. The combinational logic circuit 310 decodes the determination result into state codes $S_{TR1}$~$S_{TRN}$ and outputs the state codes $S_{TR1}$~$S_{TRN}$ to the D flip-flops $DF_{21}$~$DF_{2N}$. Since the feature of the combinational logic circuit 310 is the same as the feature of the combinational logic circuit 251 of FIG. 2A, the description of the feature of the combinational logic circuit 310 is omitted.

The D flip-flops $DF_{21}$~$DF_{2N}$ are triggered by the operation clock OPF. Each of the D flip-flops receives one state code and uses the state code as an output signal. Taking the D flip-flop $DF_{21}$ as an example, the input terminal D of the D flip-flop $DF_{21}$ receives the state code $S_{TR1}$, the output terminal Q of the D flip-flop $DF_{21}$ provides the output signal $S_{Q21}$, and the clock terminal clk of the D flip-flop $DF_{21}$ receives the operation clock OPF. Since the feature of each of the D flip-flops $DF_{21}$~$DF_{2N}$ is the same as the feature of the D flip-flop $DF_2$ of FIG. 2A, the descriptions of the features of the D flip-flops $DF_{21}$~$DF_{2N}$ are omitted.

The combinational logic circuit 320 generates the internal data component $S_D$, the address signal $S_A$, the control signal $S_C$, the test output signal MBT and the selection signal $S_{SEL}$ according to the output signals $S_{Q21}$~$S_{Q2N}$. Since the feature of the combinational logic circuit 320 is the same as the feature of the combinational logic circuit 252 shown in FIG. 2A, the description of the combinational logic circuit 320 is omitted.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A test circuit for testing a storage circuit which comprises a storage block, comprising:
   a test access circuit configured to receive a first access address, a first control command, external test data, and a mode selection signal;
   a controller configured to generate an address signal, a control signal, a data component;
   a pattern-generator circuit generating and providing test data to the storage circuit according to the data component or the external test data, wherein the storage circuit writes the external test data or the internal test data into the storage block and reads the storage block to generate read data;
   a comparing circuit comparing the test data and the read data to generate a test result; and
   a first register storing the test result,
   wherein the controller determines whether the storage circuit is working normally according to the test result stored in the first register,
   wherein:
   when a characteristic parameter of the mode selection signal meets a first predetermined condition, the test access circuit directs the controller to stop providing the address signal, the control signal, and the data component such that the pattern-generator circuit generates an access address, a control command, and the test data according to the first access address, the first control command, and the external test data and provides the access address, the control command, and the test data to the storage circuit, and when the characteristic parameter of the mode selection signal meets a second predetermined condition, the test access circuit directs the controller to provide the address signal, the control signal, and the data component so that the pattern-generator circuit generates the access address, the control command, and the test data according to the address signal, the control signal, and the data component and provides the access address, the control command, and the internal test data to the storage circuit.

2. The test circuit as claimed in claim 1, wherein the storage circuit is a static random access memory (SRAM).

3. The test circuit as claimed in claim 1, wherein the pattern-generator circuit comprises:
 a data generator generating internal test data according to the data component;
 a first selection circuit using the internal test data or the external test data as the test data according to a selection signal;
 an address generator generating a second access address according to the address signal;
 a second selection circuit outputting the first access address or the second access address to the storage circuit according to the selection signal;
 a control generator generating a second control command according to the control signal; and
 a third selection circuit outputting the first control command or the second control command to the storage circuit according to the selection signal.

4. The test circuit as claimed in claim 1, wherein the first register is a first D flip-flop, and the first D flip-flop receives the test result, uses the test result as a first output signal, and provides the first output signal to the controller according to an operation clock.

5. The test circuit as claimed in claim 4, wherein the controller comprises:
 a first combinational logic circuit receiving the first output signal, wherein in response to the first output signal indicating that the read data conforms with the test data, the first combinational logic circuit generates a state signal;
 a second D flip-flop receiving the state signal and using the state signal as a second output signal according to the operation clock; and
 a second combinational logic circuit generating the address signal, the control signal, and the data component according to the second output signal.

6. The test circuit as claimed in claim 5, wherein in response to the first D flip-flop outputting the first output signal, the second D flip-flop outputs the second output signal.

7. The test circuit as claimed in claim 5, wherein when the first D flip-flop provides the first output signal to the first combinational logic circuit, the second D flip-flop provides the second output signal to the second combinational logic circuit.

8. The test circuit as claimed in claim 4, wherein the controller comprises:

a first combinational logic circuit determining whether the storage circuit is working normally according to the mode selection signal, the test result, and series data to generate a determination result and decoding the determination result into a plurality of state codes;
 a plurality of second D flip-flops receiving the state codes and the operation clock, wherein the second D flip-flops use the state codes as a plurality of output signals according to the operation clock; and
 a second combinational logic circuit generating the address signal, the control signal, the data component according to the output signals.

9. The test circuit as claimed in claim 1, further comprising:
 a second register configured to store the test result; and
 a logic gate coupled to the first register and the second register and generating an output signal according to the test result stored in the first register and the second register,
 wherein the controller determines whether the storage circuit is working normally according to the output signal.

10. The test circuit as claimed in claim 9, wherein the logic gate is an OR gate.

11. An electronic device comprising:
 a storage circuit comprising a storage block; and
 a test circuit configured to test the storage circuit and comprising:
  a test access circuit configured to receive a first access address, a first control command, external test data, and a mode selection signal;
  a controller configured to generate an address signal, a control signal, a data component;
  a pattern-generator circuit generating and providing test data to the storage circuit according to the data component or the external test data, wherein the storage circuit writes the test data into the storage block and reads the storage block to generate read data;
  a comparing circuit comparing the test data and the read data to generate a test result; and
  a first register storing the test result,
 wherein the controller determines whether the storage circuit is working normally according to the test result stored in the first register,
 wherein:
 when a characteristic parameter of the mode selection signal meets a first predetermined condition, the test access circuit directs the controller to stop providing the address signal, the control signal, and the data component such that the pattern-generator circuit generates an access address, a control command, and the test data according to the first access address, the first control command, and the external test data and provides the access address, the control command, and the test data to the storage circuit, and
 when the characteristic parameter of the mode selection signal meets a second predetermined condition, the test access circuit directs the controller to provide the address signal, the control signal, and the data component so that the pattern-generator circuit generates the access address, the control command, and the test data according to the address signal, the control signal, and the data component and provides the access address, the control command, and the internal test data to the storage circuit.

12. The electronic device as claimed in claim 11, wherein the storage circuit is a static random access memory (SRAM).

13. The electronic device as claimed in claim 11, wherein the pattern-generator circuit comprises:
 a data generator generating internal test data according to the data component;
 a first selection circuit using the internal test data or the external test data of the external test signals as the test data according to a selection signal;
 an address generator generating a second access address according to the address signal;
 a second selection circuit outputting the first access address or the second access address to the storage circuit according to the selection signal;
 a control generator generating a second control command according to the control signal; and
 a third selection circuit outputting the first control command or the second control command to the storage circuit according to the selection signal.

14. The electronic device as claimed in claim 11, wherein the first register is a first D flip-flop, and the first D flip-flop receives the test result, uses the test result as a first output signal, and provides the first output signal to the controller according to an operation clock.

15. The electronic device as claimed in claim 14, wherein the controller comprises:
 a first combinational logic circuit receiving the first output signal, wherein in response to the first output signal indicating that the read data conforms with the test data, the first combinational logic circuit generates a state signal;
 a second D flip-flop receiving the state signal and using the state signal as a second output signal according to the operation clock; and
 a second combinational logic circuit generating the address signal, the control signal, and the data component according to the second output signal.

16. The electronic device as claimed in claim 15, wherein in response to the first D flip-flop outputting the first output signal, the second D flip-flop outputs the second output signal.

17. The electronic device as claimed in claim 11, further comprising:
 a second register configured to store the test result; and
 a logic gate coupled to the first register and the second register and generating an output signal according to the test result stored in the first register and the second register,
 wherein the controller determines whether the storage circuit is working normally according to the output signal.

18. The electronic device as claimed in claim 17, wherein the logic gate is an OR gate.

19. The electronic device as claimed in claim 11, wherein:
 the test access circuit is coupled to a test apparatus which is disposed independent of the electronic device, and
 when a characteristic parameter of the mode selection signal meets a third predetermined condition:
  the pattern-generator circuit generates the access address according to the address signal, generates the control command according to the control signal, and generates the test data according to the external test data, and
  the pattern-generator circuit provides the access address, the control command, and the test data to the storage circuit.

20. The electronic device as claimed in claim 19, wherein the test apparatus utilizes a wireless method to provide first access address, the first control command, and the external test data to the test access circuit.

* * * * *